United States Patent [19]

Kobayashi et al.

[11] Patent Number: 4,743,885
[45] Date of Patent: May 10, 1988

[54] CYCLIC TYPE D/A CONVERTER HAVING ERROR DETECTION AND CORRECTION SYSTEM

[75] Inventors: Osamu Kobayashi; Yoshiaki Shimizu, both of Yokohama; Kunihiko Gotoh, Kunitachi, all of Japan

[73] Assignee: Fujitsu Limited, Kanagawa, Japan

[21] Appl. No.: 83,399

[22] Filed: Aug. 10, 1987

[30] Foreign Application Priority Data

Aug. 9, 1986 [JP] Japan .................................. 61-187080
Aug. 19, 1986 [JP] Japan .................................. 61-192073

[51] Int. Cl.⁴ ............................................. H03M 1/66
[52] U.S. Cl. ......................... 340/347 DA; 340/347 CC
[58] Field of Search ................ 340/347 DA, 347 CC, 340/347 NT, 347 AD

[56] References Cited

U.S. PATENT DOCUMENTS 4,622,536 11/1986 Shih ............................. 340/347 DA
4,706,066 11/1987 Dijkmans .................... 340/347 DA

OTHER PUBLICATIONS

IEEE 1986 Custom Integrated Circuits Conference, pp. 366–369.

Primary Examiner—Charles D. Miller
Attorney, Agent, or Firm—Armstrong, Nikaido, Marmelstein & Kubovcik

[57] ABSTRACT

A cyclic type D/A converter having an error detection and correction system including: a code conversion circuit for converting a binary code to a multi-states code; a digital-to-analog conversion circuit connected to the code conversion circuit for converting the multi-states code to an analog value; a detection circuit operatively connected to the digital-to-analog conversion circuit for converting the analog value to a digital code; and a control circuit operatively connected to the code conversion circuit, digital-to-analog conversion circuit and detection circuit for calculating a voltage difference between the analog value at a predetermined code value and another analog value adjacent to the predetermined code value, and for calculating a differential non-linearity error from the voltage difference based on the digital code, in order to obtain error and correction values of capacitors forming the digital-to-analog conversion circuit.

10 Claims, 13 Drawing Sheets

|  | (MSB) $D_3$ | $D_2$ | $D_1$ | (LSB) $D_0$ | THEORETICAL VALUE: $\Delta$ | DETECTION VALUE: d |
|---|---|---|---|---|---|---|
| (1) (CENTER VALUE) | 0 1 | 0 1 | 0 1 | 0 1 | $\Delta_3 - \Delta_2 - \Delta_1 - \Delta_0 = d_3$ | |
| (2) (+FS/2) | 0 0 | 1 0 | 0 1 | 0 1 | $\Delta_2 - \Delta_1 - \Delta_0 = d_2$ | |
| (3) (+FS/4) | 0 0 | 0 0 | 1 0 | 0 1 | $\Delta_1 - \Delta_0 = d_1$ | |

Fig. 9

| CODE VALUE | BIT PATTERN (MSB)→(LSB) | | | | CODE CHANGE PATTERN | | SCALE |
|---|---|---|---|---|---|---|---|
| | $D_3$ | $D_2$ | $D_1$ | $D_0$ | UPPER | LOWER | |
| 15 | 1 | 1 | 1 | 1 | | TYPE 1 | |
| 14 | 1 | 1 | 1 | 0 | | 2 | |
| 13 | 1 | 1 | 1 | -1 | | 3 | |
| 12 | 1 | 1 | 0 | 0 | | 2 | |
| 11 | 1 | 1 | 0 | -1 | TYPE a | 4 | |
| 10 | 1 | 1 | -1 | 0 | | 2 | |
| 9 | 1 | 0 | 1 | -1 | | 3 | |
| 8 | 1 | 0 | 0 | 0 | | 2 | |
| 7 | 1 | 0 | 0 | -1 | | 4 | |
| 6 | 1 | 0 | -1 | 0 | b | 2 | |
| 5 | 1 | -1 | 1 | -1 | | 3 | |
| 4 | 1 | -1 | 0 | 0 | a | 2 | +FS/4 |
| 3 | 0 | 1 | 0 | -1 | | 4 | |
| 2 | 0 | 1 | -1 | 0 | a | 2 | +FS/8 |
| 1 | 0 | 0 | 1 | -1 | | 3 | |
| 0 | 0 | 0 | 0 | 0 | | 2 | |
| -1 | 0 | 0 | 0 | -1 | | 4 | |
| -2 | 0 | 0 | -1 | 0 | b | 2 | -FS/8 |
| -3 | 0 | -1 | 1 | -1 | | 3 | |
| -4 | 0 | -1 | 0 | 0 | b | 2 | -FS/4 |
| -5 | -1 | 1 | 0 | -1 | | 4 | |
| -6 | -1 | 1 | -1 | 0 | a | 2 | |
| -7 | -1 | 0 | 1 | -1 | | 3 | |
| -8 | -1 | 0 | 0 | 0 | | 2 | |
| -9 | -1 | 0 | 0 | -1 | | 4 | |
| -10 | -1 | 0 | -1 | 0 | b | 2 | |
| -11 | -1 | -1 | 1 | -1 | | 3 | |
| -12 | -1 | -1 | 0 | 0 | | 2 | |
| -13 | -1 | -1 | 0 | -1 | | 4 | |
| -14 | -1 | -1 | -1 | 0 | | 2 | |
| -15 | -1 | -1 | -1 | -1 | | 2 | |

1

CYCLIC TYPE D/A CONVERTER HAVING ERROR DETECTION AND CORRECTION SYSTEM

BACKGROUND OF THE INVENTION

1. Field of the Invention

The present invention relates to a cyclic type digital-to-analog (D/A) converter having an error detection and correction system.

2. Description of the Related Art

The conversion of a digital code to an analog value is usual in the field of information processing systems and, in general, a D/A converter must be capable of a high conversion speed, high resolution, satisfactory differential linearity, and low power consumption. D/A converters employing, for example, an R-2R ladder type conversion method or a $2^n$ weighting type conversion method are known, and in these types of converters, the conversion circuit comprises many resistors or capacitors having weighted values. Accordingly, the requirements referred to the above are considerably effected by the precision of the resistance and capacitance values forming the D/A converter, and errors in these values must be quickly detected and quickly corrected to realize the desired high speed and precise D/A conversion.

SUMMARY OF THE INVENTION

The object of the present invention is to provide a cyclic type D/A converter having an error detection and correction system which enables a high speed and precise error detection and correction.

In accordance with the present invention, there is provided a cyclic type D/A converter having an error detection and correction system including: a code conversion circuit for converting a binary code to a multi-states code; a digital-to-analog conversion circuit operatively connected to the code conversion circuit for converting the multi-states code to an analog value; a detection circuit operatively connected to the digital-to-analog conversion circuit for converting the analog value to a digital code; and a control circuit operatively connected to the code conversion circuit, digital-to-analog conversion circuit, and detection circuit, for calculating a voltage difference between the analog value at a predetermined code value and another analog value adjacent to the predetermined code value, and for calculating a differential non-linearity error from the voltage difference based on the digital code, in order to obtain error and correction values of capacitors forming the digital-to-analog conversion circuit.

BRIEF DESCRIPTION OF THE DRAWINGS

In the drawings

FIG. 9 is an explanation of change patterns of digital codes between code values;

DESCRIPTION OF THE PREFERRED EMBODIMENTS

Before describing the preferred embodiments, an explanation will be given of a conventional error detection and correction method in the D/A converter.

Figures 1, 2:
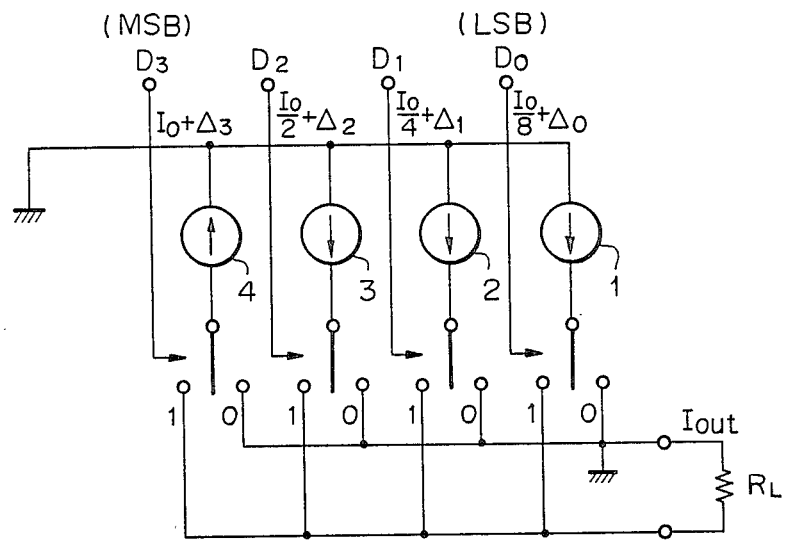
FIG. 1 is a schematic circuit diagram of one example of a conventional D/A converter.
FIG. 2 is an explanation of a differential non-linearity error.

In FIG. 1, reference numbers 1 to 4 denote current sources each supplying a weighted current value. Namely, when the current value supplied from the current source 4 is "$I_0$", each of the current values supplied from another current sources is expressed by "$\frac{1}{8}I_0$", "$\frac{1}{4}I_0$", "$\frac{1}{2}I_0$". Where $\Delta_0$ to $\Delta_3$ are error values of the current caused by the dispersion of electrical characteristic of the elements in the current source. A linear coupling of these error values is also known as a "differential non-linearity error". Therefore, each current is expressed by $\frac{1}{8}I_0+\Delta_0$, $\frac{1}{4}I_0+\Delta_1$, $\frac{1}{2}I_0+\Delta_2$ and $I_0+\Delta_3$.

Digits $D_0$, $D_1$, $D_2$ and $D_3$ are applied to a corresponding switch and the current source is connected to either the "1" or the "0" side of the switch corresponding to each of the digits $D_0$ to $D_3$. For example, when $D_0$ to $D_2$="1" and $D_3$="0", an output current $I_{out}$ becomes $\frac{7}{8}I_0$; when $D_0$ to $D_3$="0", $I_{out}$ becomes 0; and when $D_0$ to $D_2$="0" and $D_3$=1, $I_{out}$ becomes $-I_0$. This output current $I_{out}$ flows a load $R_L$ and an analog voltage is obtained from across the load $R_L$.

In FIG. 2, (1) denotes the differential non-linearity error at a code value of a center position; (2) that at a code value of a half of a full scale (FS/2); and (3), that at a code value of a quarter of the full scale (FS/4). In each case, the differential non-linearity error is expressed by a theoretical value $\Delta$ and a detection value d. In the case of (1), the value $\Delta$ between the digital code "0 0 0 0" and "1 1 1 1" is expressed by $\Delta_3$-$\Delta_2$-$\Delta_1$-$\Delta_0$, and the value d is expressed by "$d_3$". In the case of (2), the value $\Delta$ is expressed by $\Delta_2$-$\Delta_1$-$\Delta_0$, and the value d is expressed by "$d_2$". In the case of (3), the value $\Delta$ is expressed by $\Delta_1$-$\Delta_0$, and the value d is expressed by "$d_1$".

When the current source of the least significant bit (LSB, i.e., $D_0$) is set to a reference current value, the error value $\Delta_0$ is set to "0". Therefore, since the error value $\Delta_1$ of the digit $D_1$ becomes $d_1$, a value to be corrected (i.e., a correction value) is expressed by $-d_1$. Since the error value $\Delta_2$ of the digit $D_2$ becomes $d_2+\Delta_1(=d_2+d_1)$, the correction value is expressed by $-(d_2+d_1)$. Further, since the error value $\Delta_3$ of the most significant bit (MSB, i.e., $D_3$) becomes $d_3+\Delta_2+\Delta_1(=d_3+d_2+2d_1)$, the correction value is expressed by $-(d_3+d_2+2d_1)$. Consequently, when the above correction values are added to each current source, the error at each weighted current can be eliminated in the D/A conversion.

As can be understood, in the above D/A converter, since four elements (four current sources) to be weighted are provided, the detection must be made for six digital codes, and three differential non-linearity errors obtained. The correction values can be obtained from the above differential non-linearity errors. In general, in an N-bits D/A converter, (N−1) differential non-linearity errors can be calculated from the detection values for 2(N−1) digital codes. The analog-to-digital converter has been disclosed in U.S. application Ser. No. 902,870 (filed on Sept. 2, 1986).

However, in this conventional method, since the correction value must be calculated from the value detected at every digit, the process is complex and time-consuming, and as a result, it is difficult to achieve a high speed D/A conversion.

The present invention is applied to the error detection and correction in the cyclic type D/A converter. The detection process for obtaining the differential non-linearity error is carried out without regard for the number of digits in the cyclic type D/A converter, and therefore, the number of values to be detected can be reduced when detecting error values.

Namely, the number of values to be detected can be considerably reduced by the error detection and correction method according to the present invention, and thus it is possible to obtain a high speed and extremely precise D/A conversion.

Figure 3:
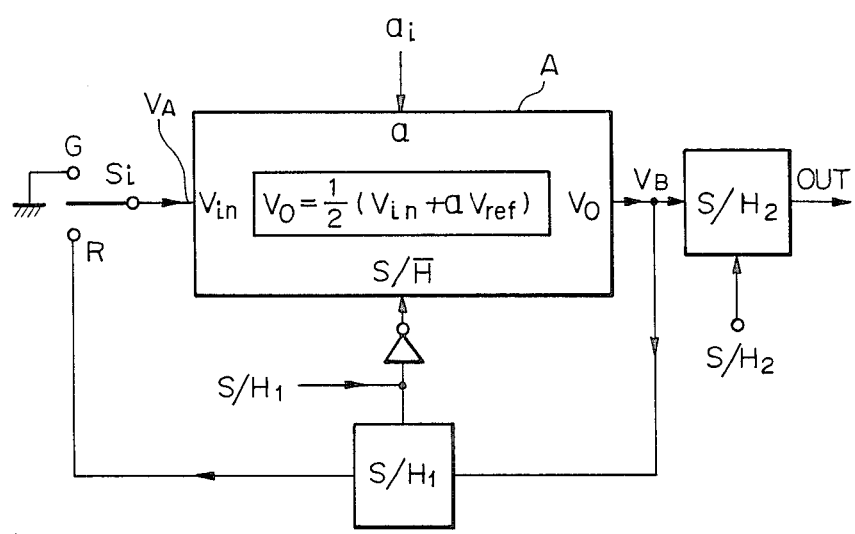
FIG. 3 is a schematic block diagram of one example of a cyclic type D/A converter.

In FIG. 3, reference letter A denotes a calculation circuit, S/H$_1$ a first sample and hold circuit, and S/H$_2$ a second sample and hold circuit. S$_i$ is a switch, and G and R are terminals for the switch S$_i$. In this case, the terminal G is connected to the ground and the terminal R is connected to the first sample and hold circuit S/H$_1$. The switch S$_i$ operates only when the initial value is set to "0". That is, when the switch S$_i$ is connected to the terminal G, the initial value is set to "0" and, thereafter, the switch S$_i$ is always connected to the terminal R. The calculation circuit A cyclically calculates each output voltage V$_0$ based on the formula $V_0 = \frac{1}{2}(V_{in} + a\ V_{ref})$: Where V$_{in}$ is an input voltage and V$_{ref}$ is a reference voltage. "a$_i$" is a digit of the digital code to be converted to an analog value. The digital code is generally shown by a$_{n-1}$, a$_{n-2}$ ... a$_1$, a$_0$ and each digit can take three states of 1, 0, −1. Therefore, a converted analog voltage corresponding to the digital code can be expressed as follows.

$$V_0 = \frac{1}{2} a_0 \cdot V_{ref}$$

$$V_1 = \left( \frac{1}{2} a_1 + \frac{1}{4} a_0 \right) V_{ref}$$

$$V_2 = \left( \frac{1}{2} a_2 + \frac{1}{4} a_1 + \frac{1}{8} a_0 \right) V_{ref}$$

$$\vdots$$

$$V_{n-1} = \left( \frac{1}{2} a_{n-1} + \frac{1}{4} a_{n-2} + \ldots + \frac{1}{2^{n-1}} a_1 + \frac{1}{2^n} a_0 \right) V_{ref}$$

Figure 4:
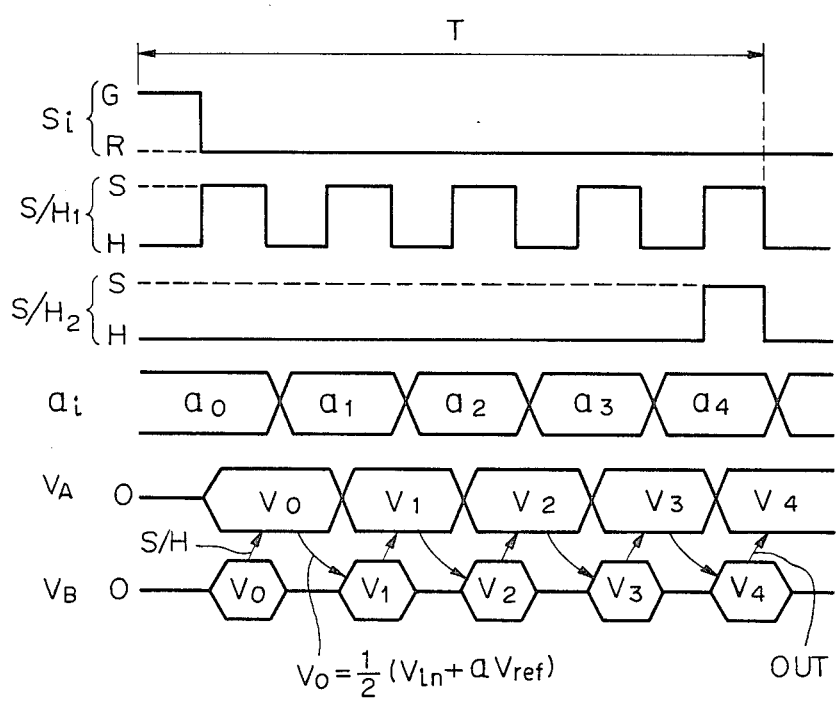
FIG. 4 is a timing chart for the circuit shown in FIG. 3.

The timing chart in FIG. 4, shows an operation of the cyclic type D/A converter shown in FIG. 3. In the Figure, T is a conversion cycle in which, for example, the digital code "a$_4$, a$_3$, a$_2$, a$_1$, a$_0$" is converted to the analog voltage V$_4$. The switch S$_i$ is first connected to the terminal G, and then connected to the terminal R when a sampling pulse is input. V$_A$ denotes input voltages V$_0$ to V$_4$ which are input to the calculation circuit A and V$_B$ denotes output voltages V$_0$ to V$_4$ which are output from the calculation circuit A. The first sample and hold circuit S/H repeatedly samples and holds the input voltage V$_B$ corresponding to each digit. In this case, S denotes the sampling state and H the holding state. The second sample and hold circuit S/H$_2$ samples and holds input voltage V$_B$ when one conversion cycle is finished, and therefore, the analog voltage V$_4$ is obtained when the output of the circuit S/H$_2$ is input.

Figure 5:
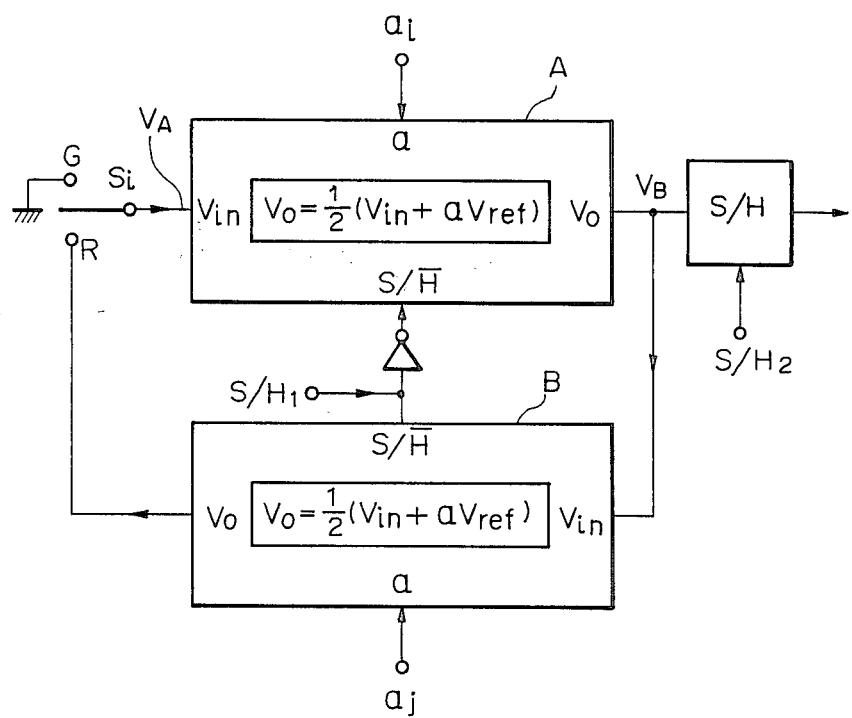
FIG. 5 is a schematic block diagram of another example of the cyclic type D/A converter.

The cyclic type D/A converter shown in FIG. 5 comprises two calculation circuits A and B. Namely, the calculation circuit B is provided instead of the sample and hold circuit S/H$_1$. In this case, an even number digit a$_i$ is input to the circuit A and an odd number digit a$_j$ is input to the circuit B. Therefore, it is possible to double the conversion speed in comparison with the circuit shown in FIG. 3.

Figure 6:
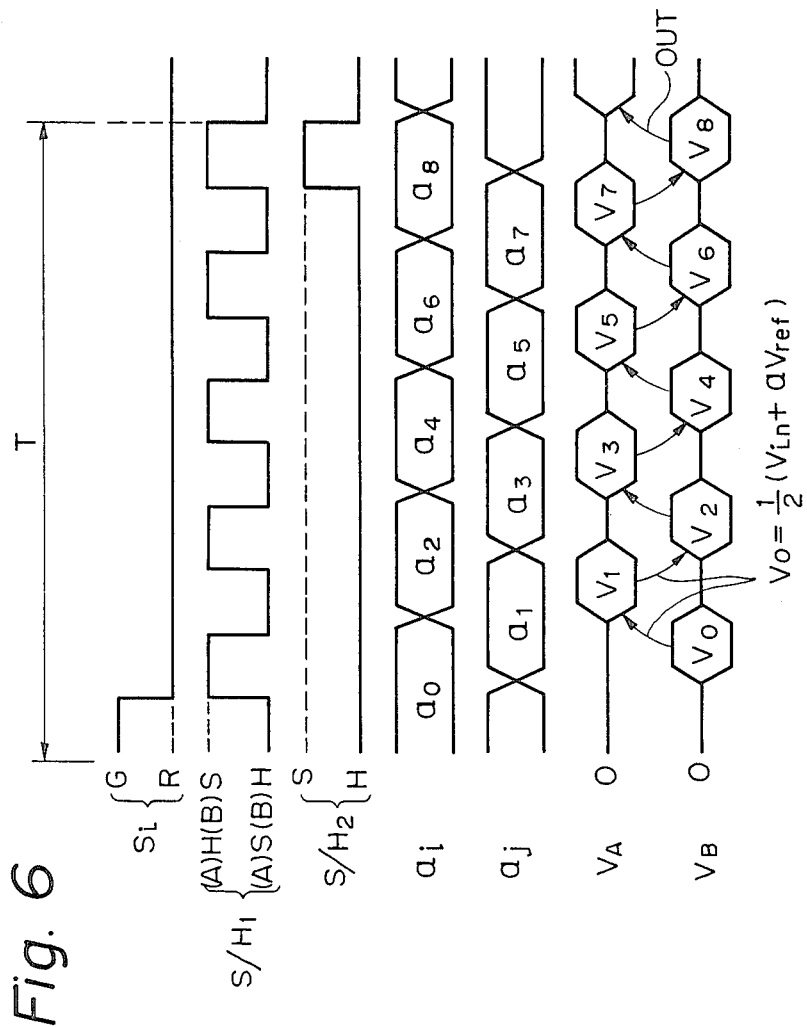
FIG. 6 is a timing chart for the circuit shown in FIG. 6.

The timing chart in FIG. 6 shows the operation of the D/A converter shown in FIG. 5. The sampling and holding states (S and H) are alternately set between the calculation circuits A and B. Therefore, for example, when the voltage V$_0$ is output from the circuit B to the circuit A, the voltage V$_1$ is output from the circuit A to the circuit B after the predetermined calculation is performed based on the formula; $\frac{1}{2}(V_{in} + a\ V_{ref})$.

Figure 7:
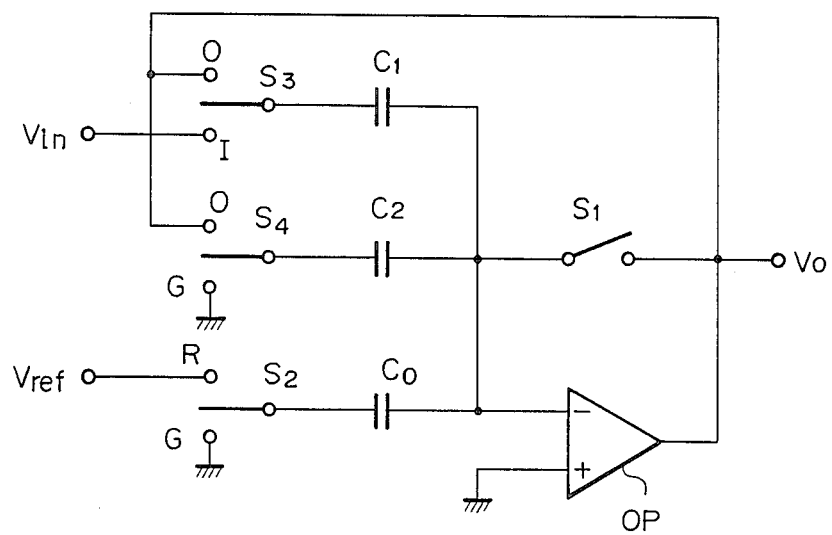
FIG. 7 is a detailed diagram of the circuits shown in FIGS. 3 and 5.
Figure 8:
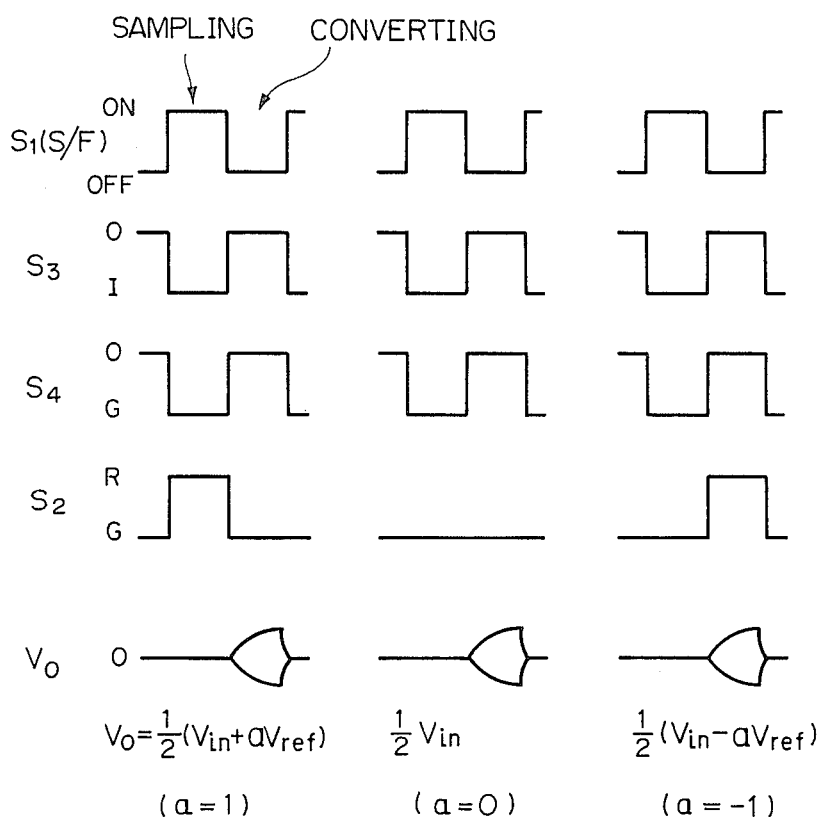
FIG. 8 is an explanation of the circuit shown in FIG. 7.

FIG. 7 shows a detailed circuit diagram of the calculation circuit shown in FIGS. 3 and 5. In the Figure, OP is an operational amplifier, C$_0$ to C$_2$ are capacitors each having an equivalent capacitance value. A charging-/discharging unit is constituted by at least one of the capacitors C$_0$ and C$_2$. The calculation in this circuit is based on the formula; $\frac{1}{2}(V_{in} + a\ V_{ref})$: Where, digit a can take three states 1, 0, −1. The operation of this circuit is explained with reference to FIG. 8.

In the sampling mode, the switch S$_1$ is closed, the capacitor C$_2$ is connected to the ground GND, and the capacitor C$_1$ is connected to the input V$_{in}$. The capacitor C$_0$ is connected to the reference V$_{ref}$ when the digit a=1, and connected to the ground G when the digit a=0 and −1. In the conversion mode, the switch S$_i$ is opened, and the switch S$_3$ and the switch S$_4$ are connected to the terminal O, and thus the capacitors C$_1$ and C$_2$ are connected in parallel to the switch S$_1$. Accordingly, the elements which affect the precision of the D/A conversion are the capacitors C$_0$, C$_1$, and C$_2$, and therefore, the capacitance values of these capacitors must be corrected.

In this case, for example, a code value "3" can be expressed by "1 0 (−1)" (4−1) and "0 1 1" (2+1) as the three states binary code. However, since the weighted value of the digital code "1 0 (−1)" and "0 1 1" is different upon conversion, the resultant analog value from these conversions is also different. Therefore, the capacitance values of these capacitors must be corrected, to eliminate the above conversion error.

FIG. 9 shows the code change patterns of digital codes, between code values shown by dotted lines or solid lines. For example, the change pattern between the code value 15 and the code value 14 is shown as "type 1". Similarly, the change pattern between 14 and 13 as "type 2", the change pattern between 13 and 12 as "type 3", and the change pattern between 11 and 10 as "type 4", as shown in the lower digit side (LSB). Therefore, the change pattern of the digital code in the LSB side is denoted by these four types as shown in the "LOWER" column. Further, in the middle and upper digit sides (MSB), the change pattern between the code value 10 and the code value 9 is shown as "type a" and the change pattern between 6 and 5 is shown as "type b". In the middle and the upper digit sides, only two types a and b are shown as typical change patterns.

Since the error values at the change patterns of types 1 to 4 are small, these types 1 to 4 are not utilized in the inventive error detection and correction method, and only the types a and b are utilized in the present invention. In type a, the digit is changed between patterns "1 −1" and "0 1", and in type b, the digit is changed between patterns "0 −1" and "−1 1". Accordingly, type b becomes similar to type a when the pattern of the type a is inverted and a symbol (+ −) of the resultant pattern inverted (i.e.

$$\text{"}\begin{matrix}1 & -1\\ 0 & 1\end{matrix}\text{"} \rightarrow \text{"}\begin{matrix}0 & 1\\ 1 & -1\end{matrix}\text{"} \rightarrow \text{"}\begin{matrix}0 & -1\\ -1 & 1\end{matrix}\text{"}).$$

Therefore, assuming that the error value for type a can be set to zero, the error value for type b also can be set to zero.

As can be understood, the error first reaches a largest value at the FS/4 position and then at the FS/8 position. Therefore, in the cyclic type D/A converter shown in FIG. 3, the error is detected at only one point, i.e., FS/4. In the converter shown in FIG. 5, the error is detected at two points, FS/4 and FS/8, because the calculation circuit A carries the even digit and the circuit B carries the odd digit as shown in FIG. 6. Therefore, when the error values are detected at these points and corrected and made zero, it is possible to make all differential non-linearity errors to zero.

An explanation will now be given of the method for obtaining the error values and the correction values according to the present invention with respect to the cyclic type D/A converter shown in FIGS. 3 and 5.

Where there are two calculation circuits as shown in FIG. 5, when the input voltage at number M calculation step is given by $V_i(M)$, $V_i(M)$ is equal to $V_0(M-1)$ because $V_0(M-1)$ denotes the output at the number $(M-1)$ calculation step. That is, $V_i(M)=V_0(M-1)$. Further, when the voltage applied to the capacitor $C_0$ is expressed by $V_P$ (when $a=1$, $V_P=V_{ref}$; when $a=0$ or $-1$, $V_P=0$) in the sampling mode and by $V_N$ (when $a=0$ or $1$, $V_N=0$; when $a=-1$, $V_N=V_{ref}$) in the conversion mode, the following formula is expressed based on "the principle of conservation of the charge" between the sampling and conversion modes. That is, $$V_P \cdot C_0 + V_i(M) \cdot C_1 = V_N \cdot C_0 + V_0(M) \cdot C_1 + V_0(M) \cdot C_2 \quad (1)$$

$$\therefore V_0(M) = \frac{C_0}{C_1 + C_2} V_P + \frac{C_1}{C_1 + C_2} V_i(M) - \frac{C_0}{C_1 + C_2} V_N$$

Therefore, when $a=1$, since $V_P=V_{ref}$ and $V_N=0$, the following result is obtained from (1).

$$V_0(M) = \frac{C_0}{C_1 + C_2} V_{ref} + \frac{C_1}{C_1 + C_2} V_i(M)$$

when $a=0$, since $V_P=0$ and $V_N=0$, the following result is obtained from (1).

$$V_0(M) = \frac{C_1}{C_1 + C_2} V_i(M)$$

and when $a=-1$, since $V_P=0$ and $V_N=V_{ref}$, the following result is obtained from (1).

$$V_0(M) = \frac{C_1}{C_1 + C_2} V_i(M) - \frac{C_0}{C_1 + C_2} V_{ref}$$

In this case, when $C_0=1+\Delta C_0$, $C_1=1+\Delta C_1$, $C_2=1$ and $V_{ref}=1$, $V_0(M)$ is obtained from (1) as follows. when $a=1$, $$V_0(M) = \frac{1 + \Delta C_0}{2 + \Delta C_1} + \frac{1 + \Delta C_1}{2 + \Delta C_1} V_i(M) \quad (2)$$

when $a=0$, $$V_0(M) = \frac{1 + \Delta C_1}{2 + \Delta C_1} V_i(M) \quad (3)$$

when $a=-1$, $$V_0(M) = \frac{1 + \Delta C_1}{2 + \Delta C_1} V_i(M) - \frac{1 + \Delta C_0}{2 + \Delta C_1} \quad (4)$$

Since the error value $\Delta C_0$ occurs in the calculation circuits A and B, $\Delta C_0 A$ is used in the circuit A and $\Delta C_0 B$ is used in the circuit B. Similarly, for the error value $\Delta C_1$, $\Delta C_1 A$ is used in the circuit A and $\Delta C_1 B$ is used in the circuit B.

The following analysis is performed to obtain the correction value, and as a result, the differential non-linearity error becomes zero.

For example, in case of 12 bits resolution, the analyses for the differential non-linearity error between the code value "1024" and "1023", and between the code value "512" and "511" are as follows. The digital code converted from the value "1024" is expressed by "1 −1 0 0 0 0 0 0 0 0 0 0", and the digital code converted from the value "1023" is expressed by "0 1 0 0 0 0 0 0 0 0 0 −1". Each digit is alternately supplied to the calculation circuits A and B as shown by the following Table 1.

TABLE 1

| | MSB | | | | digit | | | | | | | LSB |
| | | | | | Calculation circuit | | | | | | | |
| Code | B | A | B | A | B | A | B | A | B | A | B | A |
|---|---|---|---|---|---|---|---|---|---|---|---|---|
| 1024 | 1 | −1 | 0 | 0 | 0 | 0 | 0 | 0 | 0 | 0 | 0 | 0 |
| 1023 | 0 | 1 | 0 | 0 | 0 | 0 | 0 | 0 | 0 | 0 | 0 | −1 |
| (M) | 12 | 11 | 10 | 9 | 8 | 7 | 6 | 5 | 4 | 3 | 2 | 1 |

From the above condition, $V_0(1)=0$, $V_0(2)=0$, ..., $V_0(9)=0$ and $V_0(10)=0$.

Therefore, the output voltage from the calculation circuit A is expressed by the formula (4) as follows.

$$V_0(11) = -\frac{1 + \Delta C_0 A}{2 + \Delta C_1 A}$$

Accordingly, the output voltage of the value "1024" is expressed by the formula (2) as follows.

$$V_0(12) = \frac{1 + \Delta C_0B}{2 + \Delta C_1B} + \frac{1 + \Delta C_1B}{2 + \Delta C_1B}\left(-\frac{1 + \Delta C_0A}{2 + \Delta C_1A}\right)$$

$$= \frac{1 + \Delta C_0B}{2 + \Delta C_1B} - \frac{(1 + \Delta C_1B)(1 + \Delta C_0A)}{(2 + \Delta C_1B)(2 + \Delta C_1A)}$$

Next, the output voltage of the value "1023" is calculated as follows.

$$V_0(1) = -\frac{1 + \Delta C_0A}{2 + \Delta C_1A} \ldots \text{[output voltage of circuit } A\text{]}$$

$$V_0(2) = \frac{1 + \Delta C_1B}{2 + \Delta C_1B}\left(-\frac{1 + \Delta C_0A}{2 + \Delta C_1A}\right)$$

$$= -\frac{(1 + \Delta C_1B)(1 + \Delta C_0A)}{(2 + \Delta C_1B)(2 + \Delta C_1A)} \ldots$$

[output voltage of circuit $B$]

$$V_0(3) = \frac{1 + \Delta C_1A}{2 + \Delta C_1A}\left(\frac{(1 + \Delta C_1B)(1 + \Delta C_0A)}{(2 + \Delta C_1B)(2 + \Delta C_1A)}\right)$$

$$= -\frac{(1 + \Delta C_1B)(1 + \Delta C_0A)(1 + \Delta C_1A)}{(2 + \Delta C_1B)(2 + \Delta C_1A)^2} \ldots$$

[output voltage of circuit $A$]

$$V_0(10) = -\frac{(1 + \Delta C_1B)^5(1 + \Delta C_0A)(1 + \Delta C_1A)^4}{(2 + \Delta C_1B)^5(2 + \Delta C_1A)^5} \ldots$$

[output voltage of circuit $B$]

$$V_0(11) = \frac{1 + \Delta C_0A}{2 + \Delta C_1A} + \frac{1 + \Delta C_1A}{2 + \Delta C_1A}(V_0(10))$$

$$= \frac{1 + \Delta C_0A}{2 + \Delta C_1A} -$$

$$\frac{(1 + \Delta C_1B)^5(1 + \Delta C_1A)^5(1 + \Delta C_0A)}{(2 + \Delta C_1B)^5(2 + \Delta C_1A)^6}$$

[output voltage of circuit $A$]

$$V_0(12) = \frac{1 + \Delta C_1B}{2 + \Delta C_1B}(V_0(11))$$

$$= \frac{(1 + \Delta C_1B)(1 + \Delta C_0A)}{(2 + \Delta C_1B)(2 + \Delta C_1A)} -$$

$$\frac{(1 + \Delta C_1B)^6(1 + \Delta C_1A)^5(1 + \Delta C_0A)}{(2 + \Delta C_1B)^6(2 + \Delta C_1A)^6}$$

[output voltage having value "1023"]

Therefore, the differential non-linearity error is expressed as follows.

$$V_{1024} - V_{1023} = \frac{1 + \Delta C_0B}{2 + \Delta C_1B} - \frac{2(1 + \Delta C_1B)(1 + \Delta C_0A)}{(2 + \Delta C_1B)(2 + \Delta C_1A)} +$$

$$\frac{(1 + \Delta C_1B)^6(1 + \Delta C_1A)^5(1 + \Delta C_0A)}{(2 + \Delta C_1B)^6(2 + \Delta C_1A)^6}$$

The above formula is resolved by using the following approximation formula.

$$\frac{1}{(1 + C_x)^\eta} = 1 - \eta\Delta C_x$$

$$(1 + \Delta C_x)^\eta = 1 + \eta\Delta C_x$$

$$\Delta C_x \cdot \Delta C_y = 0$$

[first item]

$$(1)' = \frac{1 + \Delta C_0B}{2 + \Delta C_1B} = \frac{1 + \Delta C_0B}{2\left(1 + \frac{\Delta C_1B}{2}\right)} \approx$$

$$\tfrac{1}{2}\left(1 - \frac{\Delta C_1B}{2}\right)(1 + \Delta C_0B)$$

[second item]

$$(2)' = \frac{2(1 + \Delta C_1B)(1 + \Delta C_0A)}{(2 + \Delta C_1B)(2 + \Delta C_1A)}$$

$$= \frac{2(1 + \Delta C_1B)(1 + \Delta C_0A)}{2\left(1 + \frac{\Delta C_1B}{2}\right)2\left(1 + \frac{\Delta C_1A}{2}\right)}$$

$$\approx \tfrac{1}{2}\left(1 - \frac{\Delta C_1B}{2}\right)\left(1 - \frac{\Delta C_1A}{2}\right)(1 +$$

$$\Delta C_1B) \quad (1 + \Delta C_0A)$$

[third item]

$$(3)' = \frac{(1 + \Delta C_1B)^6(1 + \Delta C_1A)^5(1 + \Delta C_0A)}{(2 + \Delta C_1B)^6(2 + \Delta C_1A)^6}$$

$$= \frac{(1 + \Delta C_1B)^6(1 + \Delta C_1A)^5(1 + \Delta C_0A)}{2^6\left(1 + \frac{\Delta C_1B}{2}\right)^6 2^6\left(1 + \frac{\Delta C_1A}{2}\right)^6}$$

$$\approx \frac{1}{2^{12}}(1 - 3\Delta C_1B)(1 - 3\Delta C_1A)(1 + 6\Delta C_1B)$$

$$(1 + 5\Delta C_1A)(1 + \Delta C_0A)$$

Accordingly, the differential non-linearity error $\Delta E_{1029}$ between the values "1024" and "1023" is expressed as follows.

$$\Delta E_{1024} = V_{1024} - V_{1023} - \frac{1}{2^{12}} = (1)' - (2)' + (3)' - \frac{1}{2^{12}}$$

$$= \left(-\frac{1}{2} + \frac{1}{2^{12}}\right)\Delta C_0A + \left(\frac{1}{4} + \frac{1}{2^{11}}\right)\Delta C_1A +$$

$$\tfrac{1}{2}\Delta C_0B + \left(-\frac{1}{2} + \frac{3}{2^{12}}\right)\Delta C_1B$$

The same procedure as above is used for the differential non-linearity error $\Delta E_{512}$ between the values "512" and "511".

TABLE 2

| Code | Calculation circuit | | | | | | | | | | |
|---|---|---|---|---|---|---|---|---|---|---|---|
| | B | A | B | A | B | A | B | A | B | A | |
| 512 | 0 | 1 | −1 | 0 | 0 | 0 | 0 | 0 | 0 | 0 | 0 |
| 511 | 0 | 0 | 1 | 0 | 0 | 0 | 0 | 0 | 0 | 0 | −1 |

The output voltage $V_{512}$ of the value "512" is expressed as follows.

$$V_{512} = \frac{(1 + \Delta C_1 B)(1 + \Delta C_0 A)}{(2 + \Delta C_1 B)(2 + \Delta C_1 A)} -$$

$$\frac{(1 + \Delta C_1 B)(1 + \Delta C_0 B)(1 + \Delta C_1 A)}{(2 + \Delta C_1 B)^2 (2 + \Delta C_1 A)}$$

The output voltage $V_{511}$ of the value "511" is expressed as follows.

$$V_{511} = \frac{(1 + \Delta C_1 B)(1 + \Delta C_0 B)(1 + \Delta C_1 A)}{(2 + \Delta C_1 B)^2 (2 + \Delta C_1 A)} -$$

$$\frac{(1 + \Delta C_1 B)^6 (1 + \Delta C_1 A)^5 (1 + \Delta C_0 A)}{(2 + \Delta C_1 B)^6 (2 + \Delta C_1 A)^6}$$

$$\therefore V_{512} - V_{511} = \frac{(1 + \Delta C_1 B)(1 + \Delta C_0 A)}{(2 + \Delta C_1 B)(2 + \Delta C_1 A)} -$$

$$\frac{2(1 + \Delta C_1 B)(1 + \Delta C_0 B)(1 + \Delta C_1 A)}{(2 + \Delta C_1 B)^2 (2 + \Delta C_1 A)} +$$

$$\frac{(1 + \Delta C_1 B)^6 (1 + \Delta C_1 A)^5 (1 + \Delta C_0 A)}{(2 + \Delta C_1 B)^6 (2 + \Delta C_1 A)^6}$$

The differential non-linearity error $\Delta E_{512}$ is obtained by using the following approximation formula.

$$\Delta E_{512} = V_{512} - V_{511} - \frac{1}{2^{12}}$$

$$= \left(\frac{1}{4} + \frac{1}{2^{12}}\right)\Delta C_0 A +$$

$$\left(-\frac{1}{4} + \frac{1}{2^{11}}\right)\Delta C_1 A - \frac{1}{4}\Delta C_0 B +$$

$$\left(\frac{1}{8} + \frac{3}{2^{12}}\right)\Delta C_1 B$$

Therefore, the correction values $dC_1 B$ and $dC_1 A$ are expressed as follows.

$$\begin{cases} \Delta E_{1024} = -\frac{1}{2}\Delta C_0 A + \frac{1}{4}\Delta C_1 A + \frac{1}{2}\Delta C_0 B - \frac{1}{2}\Delta C_1 B \\ \Delta E_{512} = \frac{1}{4}\Delta C_0 A - \frac{1}{4}\Delta C_1 A - \frac{1}{4}\Delta C_0 B + \frac{1}{8}\Delta C_1 B \end{cases}$$

Since there are four unknown parameters in the above formulae, the solution cannot be given unconditionally. Therefore, as one example, when $\Delta C_0 A = \Delta C_0 B = 0$, the above formulae are replaced as follows.

$$\begin{cases} E\Delta_{1024} = \frac{1}{4}\Delta C_1 A - \frac{1}{2}\Delta C_1 B \\ \Delta E_{512} = -\frac{1}{4}\Delta C_1 A + \frac{1}{8}\Delta C_1 B \end{cases}$$

In this case, since $\Delta C_0 A = \Delta C_0 B = 0$, the capacitances $C_0 A$ and $C_0 B$ are not corrected, and the values $dC_1 A$ and $dC_1 B$ are given to the capacitors $C_1 A$ and $C_1 B$ as the correction values. Therefore, $\Delta C_1 A$ is replaced by $dC_1 A$ and $\Delta C_1 B$ is replaced by $dC_1 B$, the above formulae are replaced as follows.

$$\begin{cases} -\Delta E_{1024} = \frac{1}{4} dC_1 A - \frac{1}{2} dC_1 B \\ -\Delta E_{512} = -\frac{1}{4} dC_1 A - \frac{1}{8} dC_1 B \end{cases}$$

from (5) + (6)

$$-\frac{3}{8} dC_1 B = -\Delta E_{1024} - \Delta E_{512}$$

$$\therefore dC_1 B = \frac{8}{3}(\Delta E_{1024} + \Delta E_{512})$$

$$\therefore dC_1 A = \frac{16}{3}(\Delta E_{1024} + \Delta E_{512}) - 4\Delta E_{1024}$$

$$= \frac{4}{3}(\Delta E_{1024} + 4\Delta E_{512})$$

Therefore, the correction values are expressed as follows.

$$dC_1 A = \frac{4}{3}(\Delta E_{1024} + 4\Delta E_{512})$$

$$dC_1 B = \frac{8}{3}(\Delta E_{1024} + \Delta E_{512})$$

This means that only the capacitance $C_1 A$ in the circuit A is corrected to the capacitance ($C_1 A + dC_1 A.C_2 A$) and the capacitance $C_1 B$ in the circuit B is corrected to the capacitance ($C_1 B + dC_1 B.C_2 B$). Further corrections of the capacitances are not necessary in the present invention, and as a result, the differential non-linearity error is made zero by the above correction.

The following is an explanation of the calculation in the single circuit shown in FIG. 3.

Since the calculation steps are the same as for the two calculation circuits shown in FIG. 5, a detailed explanation thereof is omitted.

The conversion steps are shown by the following Table 3.

TABLE 3

| Code | MSB | | | | | digit<br>Calculation circuit | | | | | LSB |
|---|---|---|---|---|---|---|---|---|---|---|---|
| | A | A | A | A | A | A | A | A | A | A | A |
| 1024 | 1 | −1 | 0 | 0 | 0 | 0 | 0 | 0 | 0 | 0 | 0 |
| 1023 | 0 | 1 | 0 | 0 | 0 | 0 | 0 | 0 | 0 | 0 | 0 |

The output voltage of the value "1024" is expressed as follows.

$$V_0(1) = 0, V_0(2) = 0, \ldots, V_0(10) = 0$$

$$V_0(11) = -\frac{1 + \Delta C_0 A}{2 + \Delta C_1 A}$$

$$V_0(12) = \frac{1 + \Delta C_0 A}{2 + \Delta C_1 A} + \frac{1 + \Delta C_1 A}{2 + \Delta C_1 A}\left(-\frac{1 + \Delta C_0 A}{2 + \Delta C_1 A}\right)$$

$$= \frac{1 + \Delta C_0 A}{2 + \Delta C_1 A} - \frac{(1 + \Delta C_1 A)(1 + \Delta C_0 A)}{(2 + \Delta C_1 A)^2}$$

The output voltage of the value "1023" is expressed as follows.

$$V_0(1) = -\frac{1 + \Delta C_0 A}{2 + \Delta C_1 A}$$

$$V_0(2) = \frac{1 + \Delta C_1 A}{2 + \Delta C_1 A}\left(-\frac{1 + \Delta C_0 A}{2 + \Delta C_1 A}\right) =$$

$$-\frac{(1 + \Delta C_1 A)(1 + \Delta C_0 A)}{(2 + \Delta C_1 A)^2}$$

$$V_0(3) = \frac{1 + \Delta C_1 A}{2 + \Delta C_1 A}(V_0(2)) = -\frac{(1 + \Delta C_1 A)^2(1 + \Delta C_0 A)}{(2 + \Delta C_1 A)^3}$$

$$V_0(4) = \frac{1 + \Delta C_1 A}{2 + \Delta C_1 A}(V_0(3)) = -\frac{(1 + \Delta C_1 A)^3(1 + \Delta C_0 A)}{(2 + \Delta C_1 A)^4}$$

$$\vdots$$

$$V_0(10) = \frac{1 + \Delta C_1 A}{2 + \Delta C_1 A}(V_0(9)) = -\frac{(1 + \Delta C_1 A)^9(1 + \Delta C_0 A)}{(2 + \Delta C_1 A)^{10}}$$

$$V_0(11) = \frac{1 + \Delta C_0 A}{2 + \Delta C_1 A} + \frac{1 + \Delta C_1 A}{2 + \Delta C_1 A}(V_0(10))$$

$$= \frac{1 + \Delta C_0 A}{2 + \Delta C_1 A} - \frac{(1 + \Delta C_1 A)^{10}(1 + \Delta C_0 A)}{(2 + \Delta C_1 A)^{11}}$$

$$V_0(12) = \frac{1 + \Delta C_1 A}{2 + \Delta C_1 A}(V_0(11))$$

$$= \frac{(1 + \Delta C_1 A)(1 + \Delta C_0 A)}{(2 + \Delta C_1 A)^2} -$$

$$\frac{(1 + \Delta C_1 A)^{11}(1 + \Delta C_0 A)}{(2 + \Delta C_1 A)^{12}}$$

$$V_{1024} - V_{1023} = \frac{1 + \Delta C_0 A}{2 + \Delta C_1 A} - \frac{2(1 + \Delta C_1 A)(1 + \Delta C_0 A)}{(2 + \Delta C_1 A)^2} +$$

$$\frac{(1 + \Delta C_1 A)(1 + \Delta C_0 A)}{(2 + \Delta C_1 A)^{12}} = (1)'' + (2)'' + (3)''$$

The formulae $(1)''$, $(2)''$ and $(3)''$ are expressed as follows, by using the approximation formula.

$$(1)'' = \frac{1 + \Delta C_0 A}{2 + \Delta C_1 A} = \frac{1 + \Delta C_0 A}{2\left(1 + \frac{\Delta C_1 A}{2}\right)}$$

$$= \frac{1}{2}\left(1 - \frac{\Delta C_1 A}{2}\right)(1 + \Delta C_0 A)$$

$$(2)'' = \frac{2(1 + \Delta C_1 A)(1 + \Delta C_0 A)}{(2 + \Delta C_1 A)^2}$$

$$= \frac{2(1 + \Delta C_1 A)(1 + \Delta C_0 A)}{2^2\left(1 + \frac{\Delta C_1 A}{2}\right)^2}$$

$$= \frac{1}{2}(1 - \Delta C_1 A)(1 + \Delta C_1 A)(1 + \Delta C_0 A)$$

$$(3)'' = \frac{(1 + \Delta C_1 A)(1 + \Delta C_0 A)}{(2 + \Delta C_1 A)^{12}}$$

$$= \frac{(1 + \Delta C_1 A)(1 + \Delta C_0 A)}{2^{12}\left(1 + \frac{\Delta C_1 A}{2}\right)^{12}}$$

$$= \frac{1}{2^{12}}(1 - 6\Delta C_1 A)(1 + \Delta C_1 A)(1 + \Delta C_0 A)$$

Therefore, the differential non-linearity error $\Delta E_{1024}$ between the values "1024" and "1023" is expressed as follows.

$$\Delta E_{1024} = V_{1024} - V_{1023} - \frac{1}{2^{12}} = (1)'' - (2)'' + (3)'' - \frac{1}{2^{12}}$$

$$= \frac{1}{2^{12}}\Delta C_0 A + \left(-\frac{1}{4} + \frac{1}{2^{11}} + \frac{3}{2^{12}}\right)\Delta C_1 A$$

The differential non-linearity error between the value "512" and "511" is expressed as follows.

The conversion steps are shown by the following Table 4.

TABLE 4

| Code | MSB | | | | digit<br>Calculation circuit | | | | | | LSB |
|---|---|---|---|---|---|---|---|---|---|---|---|
| | A | A | A | A | A | A | A | A | A | A | A |
| 512 | 0 | 1 | −1 | 0 | 0 | 0 | 0 | 0 | 0 | 0 | 0 |
| 511 | 0 | 0 | 1 | 0 | 0 | 0 | 0 | 0 | 0 | 0 | −1 |

The output voltage of the value "512" is expressed as follows.

$$V_{512} = \frac{(1 + \Delta C_1 A)(1 + \Delta C_0 A)}{(2 + \Delta C_1 A)^2} - \frac{(1 + \Delta C_1 A)^2(1 + \Delta C_0 A)}{(2 + \Delta C_1 A)^3}$$

The output voltage of the value "511" is expressed as follows.

$$V_{511} = \frac{(1 + \Delta C_1 A)^2(1 + \Delta C_0 A)}{(2 + \Delta C_1 A)^3} - \frac{(1 + \Delta C_1 A)^{11}(1 + \Delta C_0 A)}{(2 + \Delta C_1 A)^{12}}$$

$$\therefore V_{512} - V_{511} = \frac{(1 + \Delta C_1 A)(1 + \Delta C_0 A)}{(2 + \Delta C_1 A)^2} -$$

$$\frac{2(1 + \Delta C_1 A)^2(1 + \Delta C_0 A)}{(2 + \Delta C_1 A)^3} + \frac{(1 + \Delta C_1 A)^{11}(1 + \Delta C_0 A)}{(2 + \Delta C_1 A)^{12}}$$

Therefore, the differential non-linearity error $\Delta E_{512}$ is expressed as follows.

$$\Delta E_{512} = V_{512} - V_{511} - \frac{1}{2^{12}}$$

$$= \frac{1}{2^{12}}\Delta C_0 A + \left(-\frac{1}{8} + \frac{1}{2^{11}} + \frac{3}{2^{12}}\right)\Delta C_1 A$$

The corrention value $dC_1 A$ is expressed as follows.

$$\begin{cases} \Delta E_{1024} = -\frac{1}{4}\Delta C_1 A \\ \Delta E_{512} = -\frac{1}{8}\Delta C_1 A \end{cases}$$

-continued $$\therefore dC_1A = 4\Delta E_{1024}$$
$$= 8\Delta E_{512}$$

This means that the capacitance $C_1A$ in the calculation circuit A is corrected to the capacitance value $(C_1A+dC_1A.C_2A)$. Consequently, the differential non-linearity errors at all code values can be made zero based on the correction of the above error.

In the case of the four digits $D_0$ to $D_3$ shown in FIG. 9, the differential non-linearity errors $\Delta E_4$ and $\Delta E_8$ at FS/4 and FS/8 are expressed as follows.

In FIG. 3, $$\Delta E_4 = -\tfrac{1}{4}\Delta C_1$$

In FIG. 5, $$\begin{cases} \Delta E_4 = -\tfrac{1}{2}\Delta C_0A + \tfrac{1}{4}\Delta C_1A + \tfrac{1}{2}\Delta C_0 B - \tfrac{1}{2}\Delta C_1B \\ \Delta E_8 = \tfrac{1}{4}\Delta C_0A + \tfrac{1}{4}\Delta C_1A + \tfrac{1}{4}\Delta C_0 B + \tfrac{1}{8}\Delta C_1B \end{cases}$$

Therefore, the error $\Delta E_4$ in FIG. 3 is made zero by adding the correction value $4\times \Delta E_4$ to the capacitor $C_1$.

Further, in FIG. 5, when the capacitor $C_0$ is not corrected (i.e., $\Delta C_0A = \Delta C_0B = 0$), the above formulae are replaced as follows.

$$\begin{cases} \Delta E_4 = \tfrac{1}{4}\Delta C_1A - \tfrac{1}{2}\Delta C_1B \\ \Delta E_8 = -\tfrac{1}{4}\Delta C_1A + \tfrac{1}{8}\Delta C_1B \end{cases}$$

$$\begin{cases} \Delta C_1A = -\tfrac{4}{3}(\Delta E_4 + 4\times \Delta E_8) \\ \Delta C_1B = -\tfrac{8}{3}(\Delta E_4 + \Delta E_8) \end{cases}$$

Therefore, the differential non-linearity error in FIG. 5 is made zero by adding the correction value $4/3(\Delta E_4+4\times \Delta E_8)$ to the capacitor $C_1A$ and by adding the correction value $8/3(\Delta E_4+\Delta E_8)$ to the capacitor $C_1B$.

As can be understood from the above explanation, in the present invention, the error detection is carried out at only one point (in the case of one calculation circuit as shown in FIG. 3) and one of three capacitors is corrected. Further, the error detection is carried out at two points (in the case of two calculation circuits as shown in FIG. 5) and two of six capacitors are corrected, thus making it is possible to bring the differential non-linearity error at all code value to zero.

Figure 10:
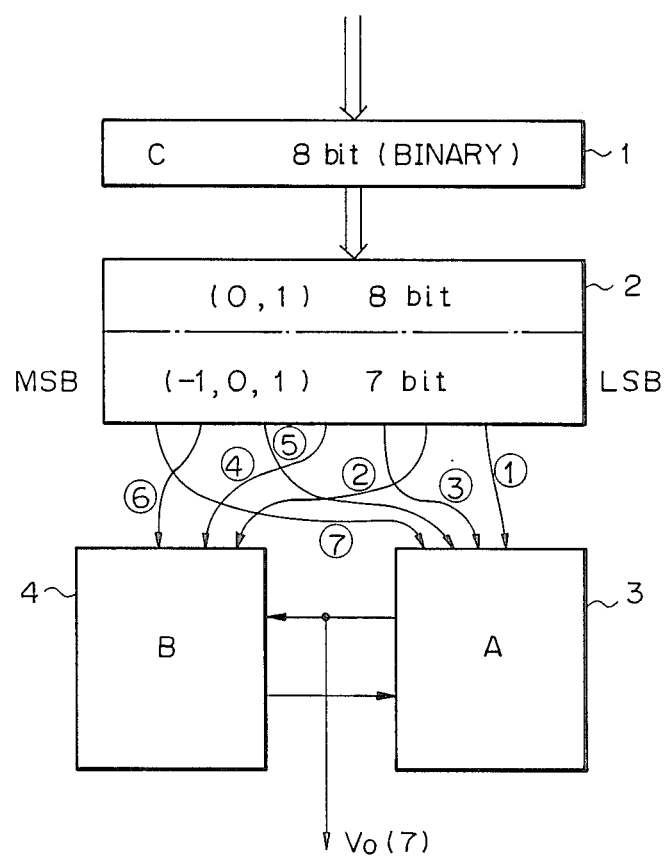
FIG. 10 is a schematic block diagram of a cyclic type D/A converter according to an embodiment of the present invention.

In FIG. 10, reference number 1 denotes a two states binary code C having, for example 8 bits; 2 denotes a code conversion block for converting the two states binary code (0, 1) to the three states binary code $(-1, 0, 1)$; and 3 and 4 denote conversion blocks. These conversion blocks A and B correspond to the calculation circuits A and B in FIG. 5.

In this structure, the conversion steps are as follows. That is, the digit ① of the three states code $(-1, 0, 1)$ at the LSB is applied to block A, the output $V_0$ is then applied from the block A to block B, and the digit ② is next applied to block B. The output of block B is then applied to block A, and digit ③ is then applied to block A. The above steps are repeated and a D/A conversion output is obtained after the digit ⑦ is applied to block A. In this case, the D/A conversion output after $(M-1)$ steps is expressed by $V_0(M-1)$, as previously explained. Therefore, the input voltage $V_i(M)$ at number M step is equal to the output voltage $V_0(M-1)$ at number $(M-1)$ step, and thus when $M=1$, the digit is LSB and $V_i(1)$ is "0". Further, when $M=N$, the output voltage $V_0(N)$ is expressed as follows.

$$V_0(N) = 2^{-N}\sum_{i=0}^{N-1} a_i 2^i V_{ref}$$

The above formula corresponds to the formula explained with reference to FIG. 3.

Figure 11:
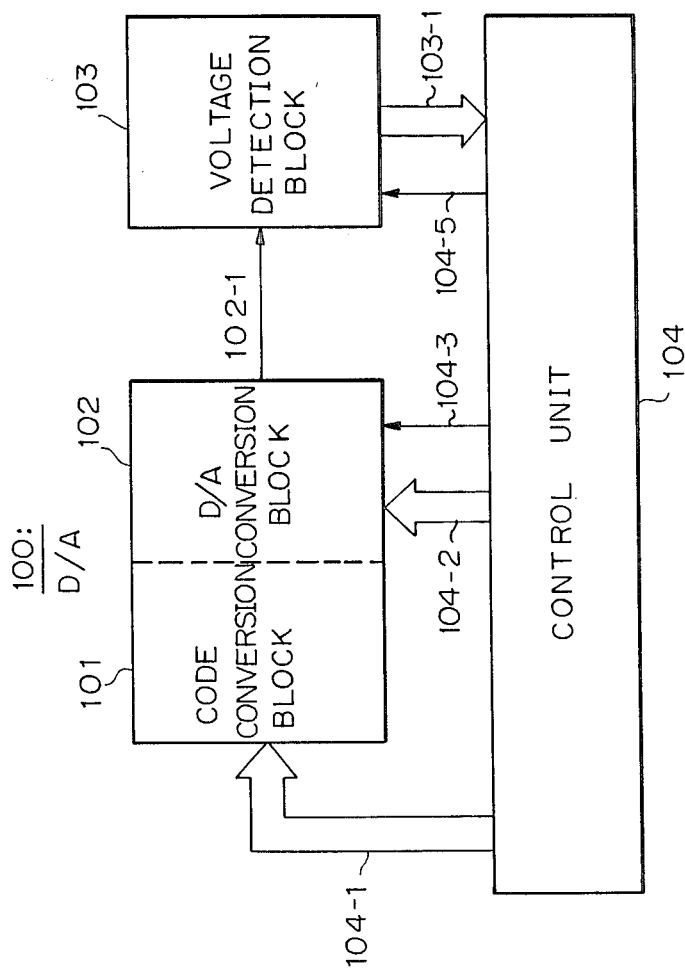
FIG. 11 is a schematic block diagram of a cyclic type D/A conversion system according to the present invention.
Figure 12:
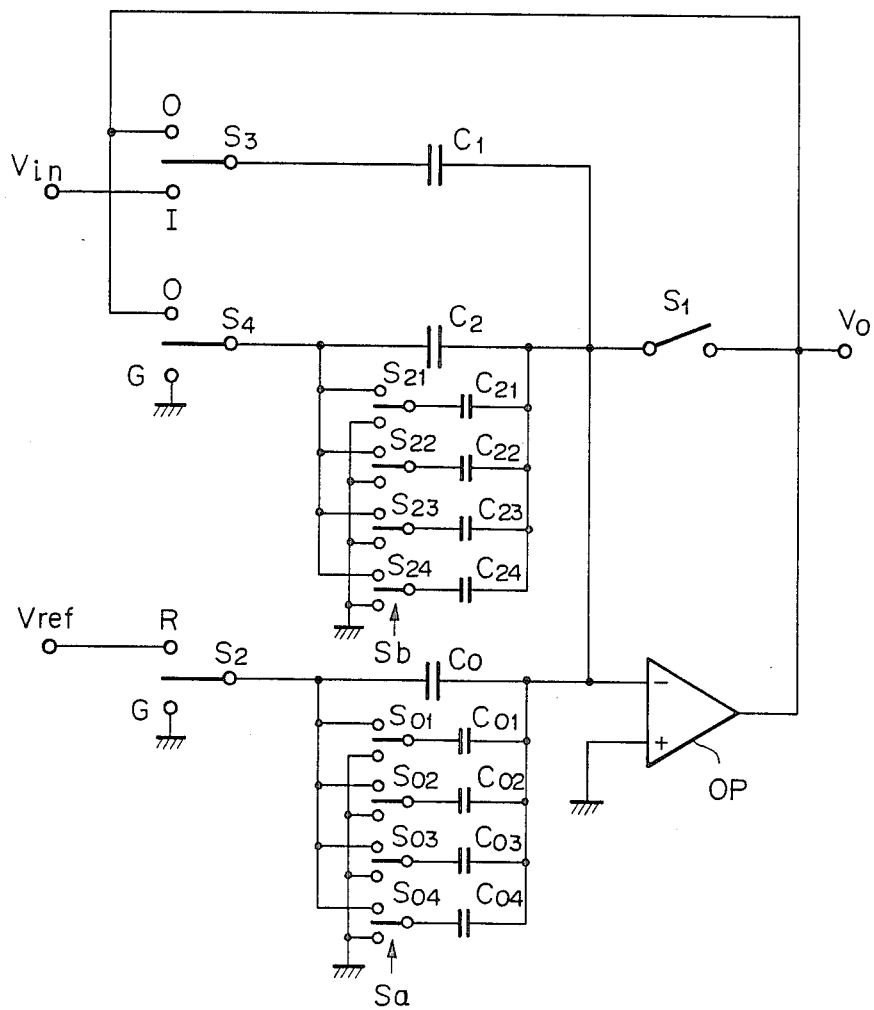
FIG. 12 is a circuit diagram of a D/A conversion unit according to an embodiment of the present invention.

In FIG. 11, the system according to the present invention comprises a cyclic type D/A converter 100 having a code conversion block 101 and a D/A conversion block, a voltage detection block for detecting an analog output voltage through a line 102-1 and for converting an analog value to a digital code, and a control unit 104 constituted by a microcomputer for controlling all sequences of the system. A control program for performing the present invention is stored in the control unit 104. An error correction means shown in FIG. 12 is provided in the D/A conversion block 102. The correction value is sent from the control unit 104 through a bus line 104-2, and a timing signal for the D/A conversion is sent from the control unit 104 through a line 104-3. The resultant detection data obtained in the voltage detection block 103 is sent to the control unit 104 through a bus line 103-1, and a timing signal for the detection is sent from the control unit 104 to the voltage detection block 103 through a line 104-5.

In the correction by the D/A converter, the code value to be converted from digital to analog is applied from the control unit 104 to the D/A converter 100 through a bus line 104-1, this code value is converted to the three states code, the three states code is sent to the conversion block 102, and the analog output from the conversion block 102 is detected by the voltage detection block 103.

The operations for correcting by the D/A converter and now explained.

(1) In an initial step, all correction values are set to zero, and the following sequences are then performed.

(2) First, the code at the $+FS/4$ position is applied from the control unit 104 to the D/A converter 100. The above code is converted to the three state code and further converted to the analog value as the D/A conversion output voltage.

(3) The analog output voltage is sent to the voltage detection block 103 through the line 102-1, and again converted to the digital code. This digital code is sent to the control unit through the bus 103-1.

(4) A code value at the (FS/4 - 1 LSB) position is then applied to the D/A converter 100.

(5) The analog output voltage is converted to the digital code in the detection block 103 by the same steps as described above, and this digital code is sent to the control unit 104.

(6) The other code value at the position of $+FS/8$ is then applied to the D/A converter 100.

(7) The analog output voltage is converted to the digital code and the digital code is sent to the control unit 104.

(8) The code value at the (FS/8 - 1 LSB) position is then applied to the D/A converter 100.

(9) The analog output voltage is converted to the digital code and the digital code is sent to the control unit 104.

(10) In the control unit 104, the correction value is calculated based on the above data obtained by the steps (3), (5), (7) and (9) and the above explained formulae.

(11) The correction value obtained by the control unit 104 is sent to the D/A converter 100 through the bus 104-2.

(12) In step (11), when the correction value is relatively small, the operation of the D/A converter appears to be correct and the correction step is finished, but when the correction value is relatively large, the correction step is returned to the step (2) and the same step is repeated. When the correction value becomes sufficiently small, the correction step is finished.

In the above embodiment, the explanation is made with respect to three capacitors $C_0$ to $C_2$. Further, the present invention can be applied to a D/A converter having a plurality of conversion elements n (n>1), for example, capacitors. Moreover, in the present invention, although the explanation is made with respect to the three states code, a multi-states binary code can be applied. In this case, the different multi-states binary code expressing the same code value are converted to the analog value, the differential non-linearity error is calculated, and then the correction value is obtained by the same steps as explained above.

In FIG. 12, capacitors $C_{01}$ to $C_{04}$ and $C_{21}$ to $C_{24}$ are supplementary capacitors for correcting each capacitance of the capacitors $C_0$ and $C_2$. Switches $S_{01}$ to $S_{04}$ and $S_{21}$ to $S_{24}$ are provided for switching between the capacitor side and the ground side, and when a switch is connected to the capacitor side, the supplementary capacitance is added and the capacitance value is corrected. These switches are switched by signals $S_a$ and $S_b$, which are sent from the control unit 104 through the line 104-3.

Figure 13:
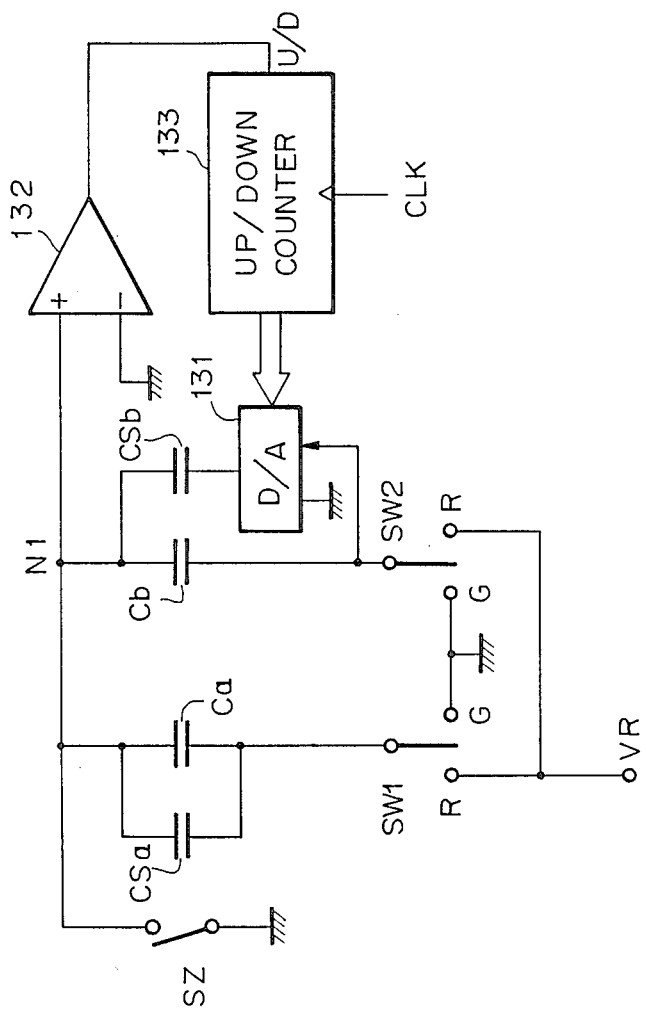
FIG. 13 is a circuit diagram of an error correction circuit according to an embodiment of the present invention.

In FIG. 13, $C_a$ and $C_b$ are capacitors to be corrected and $CS_a$ and $CS_b$ are supplementary capacitors for correcting the capacitors $C_a$ and $C_b$. Reference number 131 denotes a multiplication type D/A converter, 132 a comparator, and 133 an up-down counter. In this circuit, the capacitors $C_a$ and $C_b$ correspond to the capacitors $C_0$ and $C_2$ shown in FIG. 12, and the supplementary capacitors $CS_a$ and $CS_b$ correspond to the supplementary capacitors $C_{01}$ to $C_{04}$ and $C_{21}$ to $C_{24}$.

This error correction circuit is used during periods when the D/A converter 100 does not operate. Therefore, since a high speed correction is required, a "follow-up comparison method" using an up-down counter is employed in the circuit.

Figure 14:
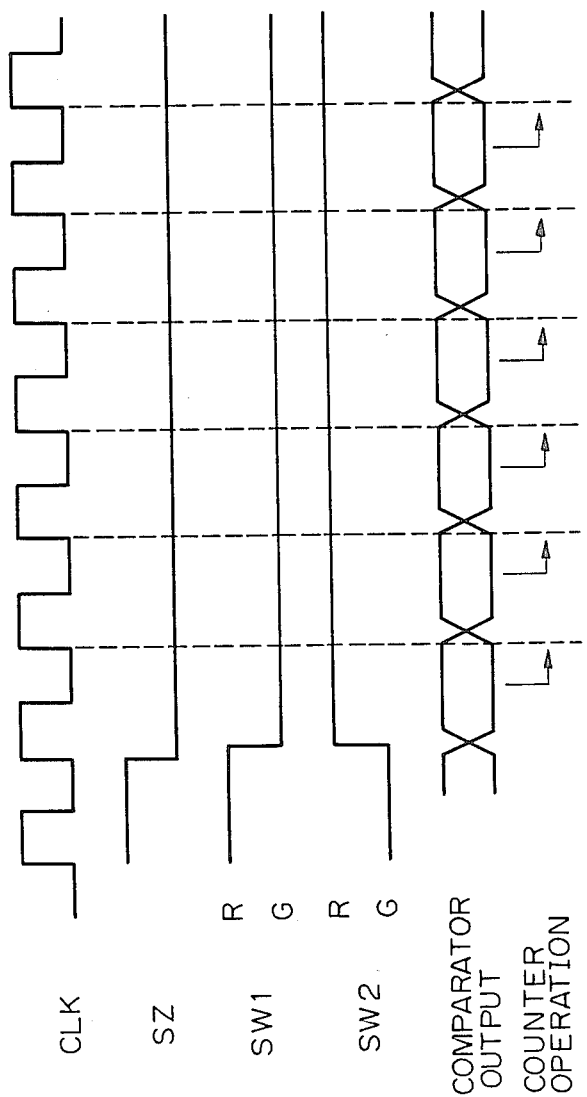
FIG. 14 is a timing chart for the circuit shown in FIG. 13.

The operations of this circuit are now explained with reference to FIG. 14.

First, the switch SZ is closed so that the potential of the node N1 becomes zero. Next, the switch SW1 is connected to the terminal R and the switch SW2 is connected to the terminal G, and accordingly, the capacitors $C_a$ and $CS_a$ are charged by the reference voltage VR and the capacitor $C_b$ is connected to the ground.

Next, the switch SZ is opened, the switch SW1 is connected to the terminal G, and the switch SW2 is connected to the terminal R. After the above steps, a potential difference caused by the capacitance difference between $C_a+CS_a$ and $C_b+CS_b$ occurs at the node N1. This potential is compared by the comparator 132, and the resultant data is input to the up-down counter 133. Accordingly, either a count-up or count-down operation is performed in the up-down counter 133 in response to an up-down signal (U/P) from the comparator 132. A clock signal CLK is input to the up-down counter 133 and the D/A converter 131 is controlled by an output of the up-down counter 133.

For example, when the capacitance $C_b+CS_b > C_a+CS_a$, a plus voltage occurs in the node N1. In this case, the signal U/D indicating the count-down is sent from the comparator 132 to the up-down counter 133. In the count-down, since the analog voltage from the D/A converter 131 is pulled down, the analog voltage supplied to the capacitor $CS_b$ is also pulled down, so that the capacitance of the capacitor $CS_b$ becomes small. Conversely, in the count-up, since the analog voltage from the D/A converter 131 is pulled up, the analog voltage supplied to the capacitor $CS_b$ is also pulled up so that the capacitance of the capacitor $CS_b$ becomes large.

In the conventional error correction circuit, a successive approximation register is used instead of the up-down counter. However, in the conventional type, about 6 $\mu$s to 60 $\mu$s is needed, to carry out a correction, hindering the high speed operation of the cyclic D/A conversion.

In the present invention, since the follow-up comparison method using the up-down counter is employed, only about 1 to 2 $\mu$s needed for a correction. This is because the correction of the capacitor is performed in such a way that the next correction value is corrected based on the previous correction value carried by the up-down counter 133. As previously explained, the correction values $\Delta C_0$ to $\Delta C_2$ are expressed as a plus or minus value. Therefore, when these plus or minus values are applied to the up-down counter 133, the correction value can be easily adjusted.

This error correction circuit can be utilized to a circuit other than the cyclic D/A converter according to the present invention, only by changing the element to be corrected.

We claim:

1. A cyclic type D/A converter having an error detection and correction system comprising:
   a code conversion means for converting a binary code to a multi-states code;
   a digital-to-analog conversion means operatively connected to said code conversion means for converting said multi-states code to an analog value;
   a detection means operatively connected to said digital-to-analog conversion means for converting said analog value to a digital code; and
   a control means operatively connected to said code conversion means, digital-to-analog conversion means and detection means, for calculating a voltage difference between said analog value at a predetermined code value and another analog value adjacent to said predetermined code value, and for calculating a differential non-linearity error from said voltage difference based on said digital code, in order to obtain error and correction values of capacitors forming said digital-to-analog conversion means.

2. A cyclic type D/A converter as claimed in claim 1, wherein said digital-to-analog conversion means comprises:
- an operational amplifier having at least a non-inverting input terminal, an inverting input terminal and an output terminal;
- a first switching means provided between said inverting input terminal and said output terminal;
- a first capacitor connected to said inverting input terminal at one end thereof and connected to a second switching means for changing between an input terminal and an output terminal of said converter;
- a charging/discharging unit constituted by at least one capacitor and a third switching means, each of said capacitors being connected to said inverting input terminal at one end thereof and having approximately an equivalent capacitance value to that of said first capacitor, said third switching means being selectively connected to said output terminal or a reference voltage terminal or a ground terminal in correspondence with a sampling mode or a conversion mode; and
- correction means comprising a plurality of supplementary capacitors and switches, each of said supplementary capacitors and switches being connected in series, said correction means being connected in parallel to each of said capacitors forming said changing/discharging unit.

3. A cyclic type D/A converter as claimed in claim 1, wherein said multi-states code consists of a three states code.

4. A cyclic type D/A converter as claimed in claim 1, wherein said control means comprises a microcomputer.

5. A cyclic type D/A converter as claimed in claim 1, wherein said control means further comprises an error correction circuit.

6. A cyclic type D/A converter as claimed in claim 5, wherein said error correction circuit comprises a comparator for comparing a potential of said capacitors to be corrected with a reference voltage, an up-down counter for counting-up or down based on resultant data from said comparator, and a multiplication type D/A converter for dividing an analog voltage supplied to a supplementary capacitor.

7. A method for detecting and correcting errors upon digital-to-analog conversion in a cyclic type D/A converter comprising steps of:
- converting a binary code to a multi-states code;
- converting said multi-states code to an analog value;
- detecting said analog value and again converting said analog value to a digital code;
- calculating a voltage difference between said analog value at a predetermined code value and another analog value at another code value adjacent to said predetermined code value based on said digital code;
- calculating a differential non-linearity error from said voltage difference using an approximation formula;
- obtaining a correction value based on said differential non-linearity error; and
- correcting a capacitance of a capacitor forming a digital-to-analog conversion unit based on said correction value.

8. A method for detecting and correcting errors as claimed in claim 7, wherein said predetermined code value is set to a position of ¼ full scale and said another code value adjacent to said predetermined code value is set to a position of ¼ full scale−1 least significant bit, where said digital-to-analog conversion unit comprises one calculation circuit for repeatedly calculating said analog value.

9. A method for detecting and correcting errors as claimed in claim 7, wherein said predetermined code value is set to the positions of ¼ full scale and ⅛ full scale, and said another code value is set to the position of ¼ full scale−1 least significant bit and ⅛ full scale−1 least significant bit, where said digital-to-analog conversion unit comprises two calculation circuits for repeatedly calculating said analog value.

10. A method for detecting and correcting errors as claimed in claim 7, wherein said multi-states code consists of a three states code.

* * * * *